United States Patent
Xu

[11] Patent Number: 6,057,734
[45] Date of Patent: May 2, 2000

[54] SYMMETRICAL ANALOG POWER AMPLIFIER

[75] Inventor: Ping Xu, Milpitas, Calif.

[73] Assignee: Seiko Epson Corporation, Tokyo, Japan

[21] Appl. No.: 09/231,885

[22] Filed: Jan. 14, 1999

[51] Int. Cl.$^7$ ........................................................ H03F 3/45
[52] U.S. Cl. ............................ 330/253; 330/255; 330/261
[58] Field of Search ................................... 330/253, 255, 330/261

[56] References Cited

U.S. PATENT DOCUMENTS

| | | | |
|---|---|---|---|
| 4,453,134 | 6/1984 | Pernyeszi | 330/255 |
| 4,480,230 | 10/1984 | Brehmer et al. | 330/255 |
| 4,730,168 | 3/1988 | Senderowicz et al. | 330/253 |
| 4,739,281 | 4/1988 | Doyle | 330/253 |
| 4,829,266 | 5/1989 | Pernici et al. | 330/253 |
| 4,881,045 | 11/1989 | Dillman | 330/253 |
| 4,935,703 | 6/1990 | Poletto | 330/255 |
| 4,990,862 | 2/1991 | Narabu et al. | 330/253 |
| 5,210,506 | 5/1993 | Koch et al. | 330/255 |
| 5,293,136 | 3/1994 | Ryat | 330/258 |
| 5,315,264 | 5/1994 | Sundby et al. | 330/253 |
| 5,334,948 | 8/1994 | Fong et al. | 330/253 |
| 5,442,319 | 8/1995 | Seesink et al. | 330/253 |
| 5,515,006 | 5/1996 | Chan | 330/255 |
| 5,521,553 | 5/1996 | Butler | 330/265 |
| 5,574,401 | 11/1996 | Spitalny | 330/253 |
| 5,736,886 | 4/1998 | Mangelsdorf et al. | 327/310 |

*Primary Examiner*—Michael B Shingleton

[57] ABSTRACT

A symmetrical analog power amplifier employing CMOS technology comprising an input stage and an improved output stage having a pull up/down arrangement to provide improved operating characteristics. The amplifier includes a pair of input transistors that receive an input signal and a node on which a first output voltage is generated. The amplifier further includes an improved output stage comprising an intermediate current source circuit that includes a first current source transistor, a control transistor and a second current source transistor connected in series. A first output voltage is generated on a node interconnecting the control transistor and the second current source transistor. A second output voltage, which is responsive to the first output voltage, is generated on a node connecting the first current source transistor and the control transistor. The output stage further includes a first output transistor responsive to the first output voltage and a second output transistor responsive to the second output voltage. A third output voltage, which is the output voltage of the amplifier, is generated on an output node interconnecting the first and second output transistors. A power down circuit may be embodied in the amplifier to reduce its power consumption.

16 Claims, 2 Drawing Sheets

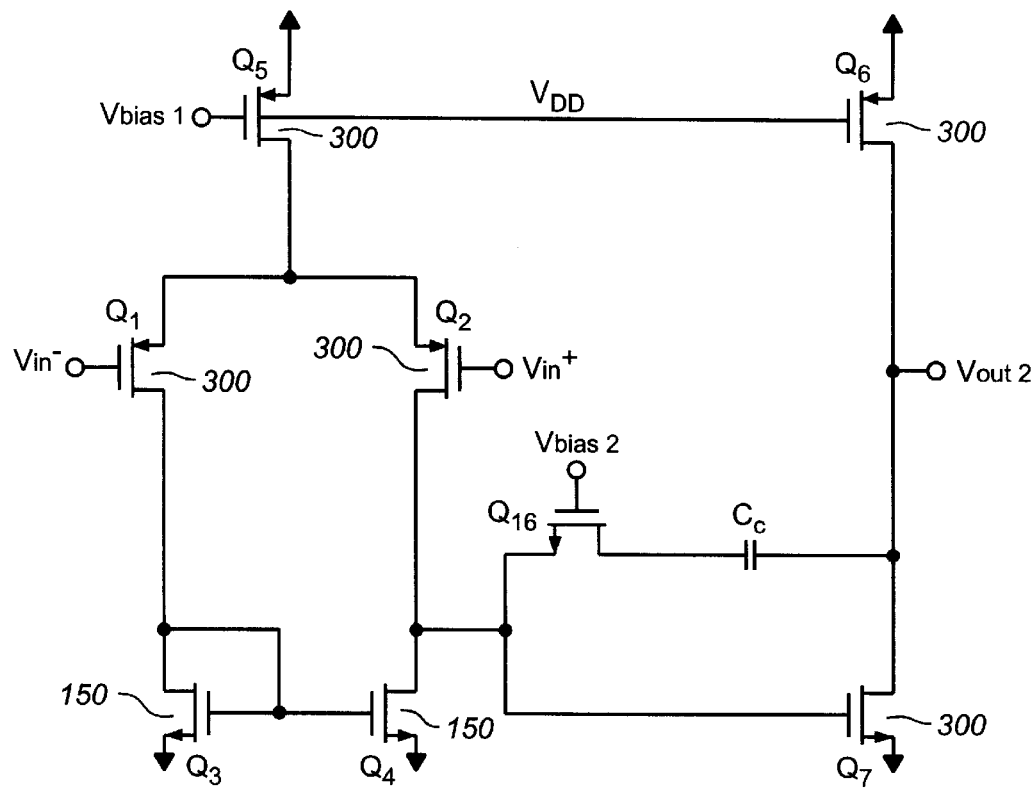
FIG._1
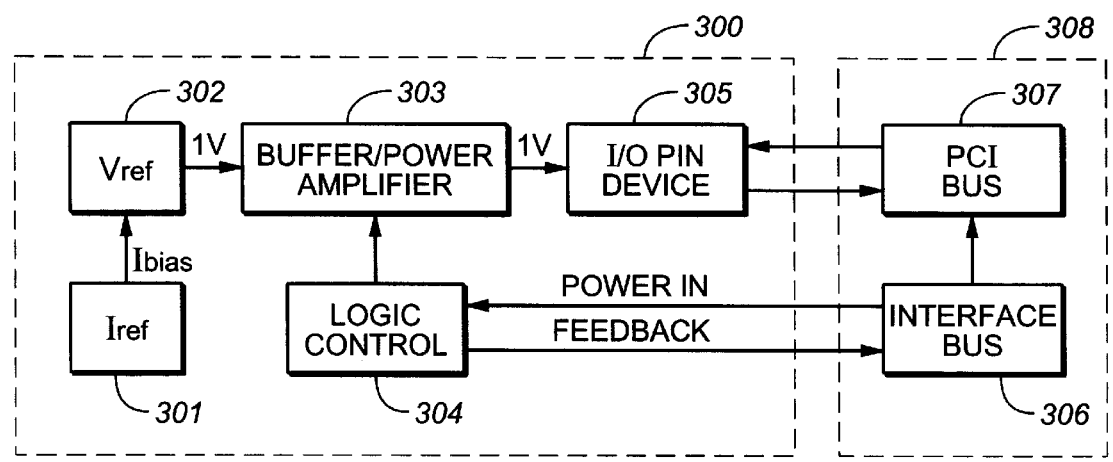
FIG._3

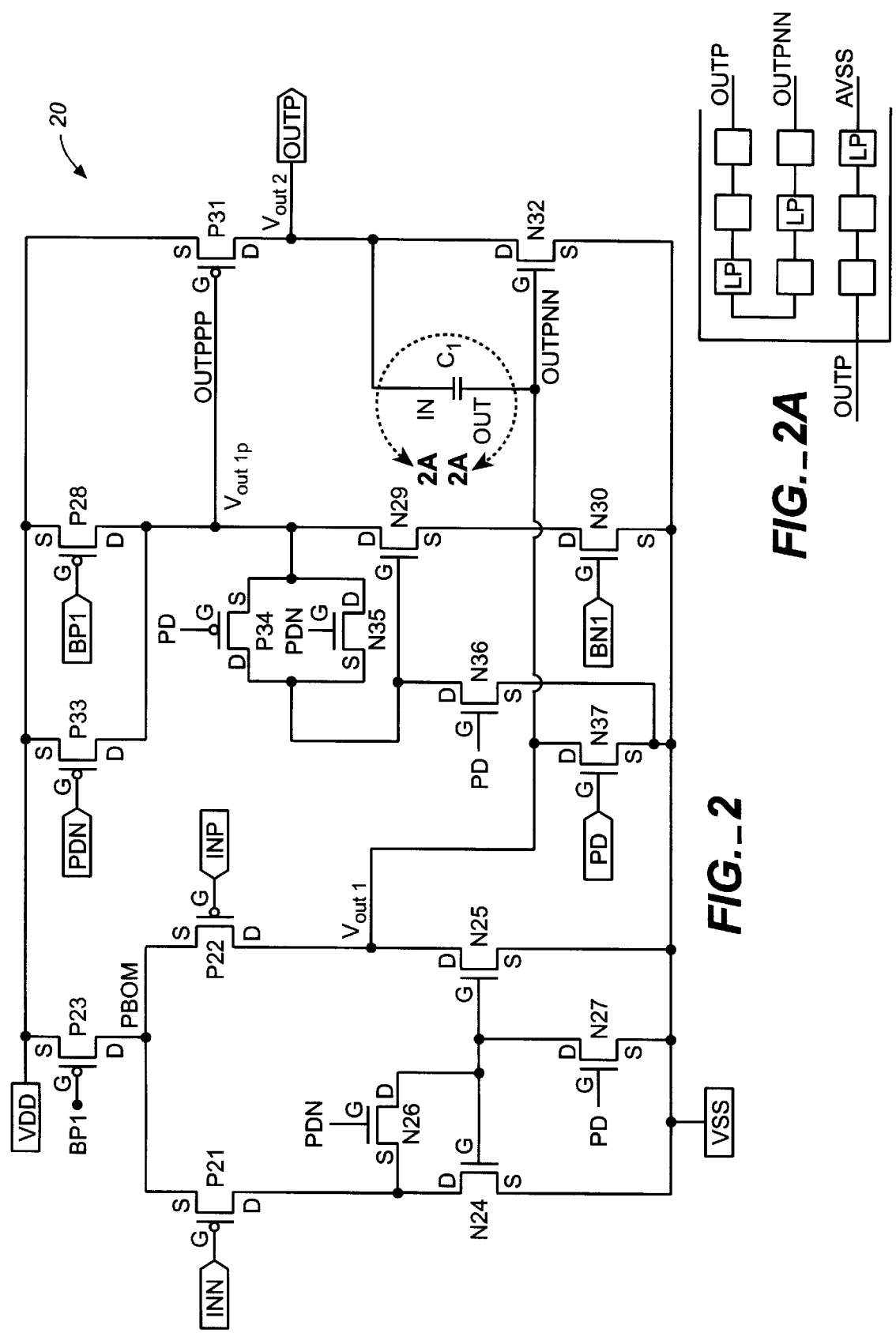

SYMMETRICAL ANALOG POWER AMPLIFIER

BACKGROUND OF THE INVENTION

1. Field of the Invention

This invention pertains to a symmetrical analog power amplifier, and more particularly to an analog power amplifier which includes an output stage that has a pull up/pull down arrangement to provide improved performance characteristics. The amplifier also includes a power down circuit to reduce power consumption. The symmetrical analog power amplifier of this invention is designed to be used in a variety of applications including computer network cards, as well as other devices.

2. Description of the Related Art

Power amplifiers have high power output stages and are widely used as voltage reference signal buffers and for providing circuit isolation. Such amplifiers have high input impedance and low output impedance. Having low output impedance enables the amplifier to deliver the output signal to a large load without significant distortion.

A conventional power amplifier in the form of a two-stage op amp is shown on the attached FIG. 1. The amplifier uses a p-input stage, which generates less 1/f noise, has a higher slew rate and has a more favorable input range than an n-input stage. This amplifier is used when the input signal is not too high (i.e., between VSS and VDD—0.7).

The first stage of the conventional amplifier is a differential input stage comprising a pair of PMOS input transistors Q1 and Q2 which are actively loaded with a pair of NMOS transistors that are connected in current mirror configuration. A PMOS current source transistor Q5, controlled by a bias voltage $V_{bias1}$ which is applied to the gate of Q5, supplies current to each of the input transistors Q1 and Q2. The input stage produces a single ended output voltage $V_{out1}$ at the node defined by the drain-drain connection between Q2 and Q4. This node where $V_{out1}$ is generated interconnects the input stage with a compensation network of the second stage which is an output stage. The compensation network, which includes transistor Q16 and capacitor Cc, is connected between the node where $V_{out1}$ is produced and the output node where $V_{out2}$ is generated. The output stage includes a current amplifier transistor Q7 that is actively loaded with a PMOS current source transistor Q6. Q6 and Q7 are controlled by $V_{bias1}$ and $V_{out1}$ respectively. $V_{out2}$ is taken off of the node formed by the drain—drain connection between Q6 and Q7.

In operation, the current through Q7 changes as $V_{out1}$ and $V_{out2}$ change. With the compensation components Q16 and Cc, the amplifier provides a relatively stable output. However, one disadvantage to this design is that the pull up current available for charging the load is limited by Q6 which limits the current therethrough to a relatively small amount (i.e., 0.5 mA). The amplifier's weak pull up capability coupled with its strong pull down capability (that is, its ability to discharge current from the load) results in an asymmetric output signal and large distortion. Another disadvantage to this design is that the amplifier lacks the capability to reduce power consumption when it is in an idle state (i.e., when no input signal is applied) because it has a large cross current in the idle state.

OBJECTS OF THE INVENTION

Therefore, it is an object of this invention to overcome the aforementioned problems.

It is another object of this invention to provide a symmetrical analog power amplifier having an improved output stage including a pull up/pull down arrangement to provide efficient use of the output current and large driving ability.

It is a further object of this invention to provide a symmetrical analog power amplifier which generates a symmetrical output signal that has a high slew rate, low distortion and is very responsive to changes in the input signal.

It is still another object of this invention to provide a symmetrical analog power amplifier having a selectively controlled power down circuit to reduce the current drawn from the power supply.

SUMMARY OF THE INVENTION

In accordance with one aspect of the invention, a symmetrical analog power amplifier is provided which includes an input stage comprising a pair of input MOS transistors that receives an input signal and a first output node where a first output voltage is generated. The amplifier further includes an improved output stage including a pull up/pull down arrangement. The output stage comprises an intermediate current source circuit that comprises a plurality of MOS transistors including a first current source transistor, a control transistor and a second current source transistor connected in series. The node on which the first output voltage is generated is connected to a node connecting the control transistor and the second current source transistor. A second output voltage is generated on a node connecting the first current source transistor and the control transistor. The output stage further includes a plurality of output transistors including a first output transistor responsive to the first output voltage and a second output transistor responsive to the second output voltage. The output stage includes a node on which a third output voltage, which is the output voltage of the amplifier, is generated.

Preferably, the second output voltage is responsive to the first output voltage and is approximately equal to the sum of the first output voltage and a gate-to-source voltage of the control transistor. Also, the gate-to-source voltage of the control transistor may be controlled by the size of the control transistor and the current of the second current source transistor. A transmission gate may be employed to interconnect the gate of the control transistor with the node on which the second output voltage is connected.

Preferably, the first and second output transistors are interconnected to form an output node where the third output signal is generated.

The symmetrical analog power amplifier preferably further comprises a power down circuit.

The symmetrical analog power amplifier has a wide variety of applications. For example, it may be incorporated into an integrated circuit which is embodied on a computer network card.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a conventional two-stage operational amplifier;

FIG. 2 is a symmetrical analog power amplifier constructed in accordance with embodiments of the invention; and FIG. 3 is a block diagram showing the interconnection of various components of an integrated circuit which may be embodied on a network card, including a buffer/power amplifier circuit in which the symmetrical analog power amplifier of the present invention is adapted to be embodied.

DESCRIPTION OF THE PREFERRED EMBODIMENTS

Referring to FIG. 2, a diagram of a symmetrical analog power amplifier 20 is illustrated in accordance with preferred embodiments of the invention. As shown in FIG. 2, the amplifier has two stages and may be powered by a power supply connected to VDD with VSS grounded. The single power supply may be, for example, 3.3 or 5.0 V. In accordance with CMOS technology, the amplifier 21 comprises a plurality of MOS transistors of both the NMOS and PMOS type. In the illustrated embodiments NMOS transistors are designated with the prefix N and PMOS transistors with the prefix P.

The first stage is a p-input stage that receives an input signal (Vin) in the range of VSS to (VDD−0.7 V). The p-input stage comprises a pair of PMOS input transistors P21 and P22 that receive input voltages INN and INP respectively. When amplifier 20 is used as a buffer or voltage follower, as in the preferred embodiment, the output voltage node ($V_{out2}$) is coupled to the INN input voltage node. In that case, $V_{in}$=INP. However, if both INN and INP are used as inputs, then $V_{in}$=|INN−INP|.

Current source transistor P23, which is controlled by a bias voltage BP1, supplies current to the two input transistors. The input transistors P21 and P22 are actively loaded with a pair of NMOS transistors N24 and N25 which are connected in current mirror configuration under normal operating conditions when transistor N26 is on. The input stage includes another transistor, N27, which is off under normal operating conditions. In a power down mode the modes of operation of N26 and N27 are reversed; that is, N26 is off and N27 is on to reduce the power consumed in the input stage. N26 and N27 are part of a larger power down circuit embodied in the amplifier 20. As shown in FIG. 2, the input stage produces a single ended output voltage $V_{out1}$ (or OUTPNN) at the node defined by the drain-drain connection between P22 and N25. This node where $V_{out1}$ is generated interconnects the input stage with the second stage which is an output stage.

The output stage includes a PMOS current source transistor P28, an NMOS control transistor N29 which acts as a single transistor amplifier, and an NMOS current source transistor N30 connected in series. The output stage further includes a pair of output transistors, PMOS transistor P31 and NMOS transistor N32. An output voltage $V_{out2}$ is taken off of the node defined by the drain—drain connection between P31 and N32. When amplifier 20 is used as a buffer, the $V_{out2}$ voltage node is connected to the INN voltage node.

In accordance with the invention, the node where $V_{out1}$ is produced is connected to the source-drain connection between N29 and N30 and is also connected to the gate of N32. Thus, N32 is controlled by the output voltage, $V_{out1}$, of the input stage. A capacitor $C_1$ is interposed between the $V_{out1}$ and $V_{out2}$ nodes to prevent or minimize oscillations in the amplifier 20. Capacitor $C_1$ has a capacitance of approximately 6 pF and is preferably a double-poly capacitor. The node defined by the drain-drain connection between P28 and N29 generates a voltage $V_{out1p}$ (or OUTPPP) which controls P31.

A CMOS transmission gate comprising a PMOS transistor P34 and an NMOS transistor N35 provides a switch between the gate of N29 and the node where $V_{out1p}$ is generated. The gates of P34 and N35 are controlled by complementary voltage signals denoted PD and PDN. The transmission gate can pass voltages within the entire range of the voltage signal at the gate of N29. When PDN is at the low level and PD is at the high level, N35 and P34 will both be prevented from conducting for any voltage within this range at the gate of N29. Thus, with PDN low and PD high the switch is open. Under normal operating conditions, PDN is high and PD is low. Correspondingly, N35 will conduct for voltages at the gate of N29 in the range of approximately VSS to (VDD−0.7) and P34 will conduct for voltages at the gate of N29 in the range of approximately (VSS+0.7) to VDD. Thus, the entire range of voltages which may be conducted extends from VSS to VDD. As the resistance of one of the transmission gate transistors decreases, the resistance of the other increases, with the parallel equivalent "on" resistance of the transmission gate remaining approximately constant. When the output signal is stable, (i.e., when $V_{out2}$=$V_{in}$ in the case where amplifier 20 is used as a buffer, or if not used as a buffer when $V_{out2}$=its final or stable value) little or no current flows through the transmission gate. Thus, $V_{out1p}$=$V_{out1}$+$V_{GS(N29)}$. Moreover, when the output signal is stable $I_{P28}$=$I_{N30}$, in which case $V_{GS(N29)}$ is controlled by the size of N29 and the current of N30.

Several advantages result from this arrangement when the amplifier 20 is used as a buffer. One is that $V_{out1p}$ can track $V_{out1}$ very closely and respond to changes in $V_{out1}$ very fast. For example, when $V_{out1}$ drops, $V_{GS(N29)}$ increases, increasing the current through N29 which pulls $V_{out1p}$ down quickly. This enables P31 to quickly draw more current for charging the load at $V_{out2}$. At the same time, because of the drop in $V_{out1}$, the discharge current through N32 decreases. This makes for efficient use of the output current and provides the amplifier 20 with strong pull up ability, which, together with its strong pull down capability, increases the driving ability of the amplifier 20. This arrangement also enables the amplifier 20 to generate a symmetrical output signal that has a high slew rate, low distortion and is very responsive to changes in the input signal. In addition, the current through both P31 and N32 (i.e., the cross-over current) can be kept to a minimum to reduce the dc idle current and thereby reduce the overall power consumption of the circuit.

With this arrangement, the amplifier 20 is able to maintain a very small offset error between the input and output signals when the output signal is stable and to quickly adjust the output signal $V_{out2}$ when the input signal changes. As previously noted, when the output signal is stable, $I_{P28}$=$I_{N30}$, making the impedance at the node where $V_{out1}$ is generated very large. This will result in a high gain of the first stage since the gain of that stage is proportional to the impedance at the node where the output signal of that stage, $V_{out1}$, is generated. Then, when the input signal changes, $I_{P28}$≠$I_{N30}$, causing the impedance at $V_{out1}$ to decrease to assist in speeding up the transition of the output signal.

As previously noted, the amplifier of the subject invention has a power down circuit controlled by complementary voltage signals PD and PDN to reduce power consumption. Power down transistors in the output stage include N26, N27, P33, P34, N35, N36 and N37. The amplifier is in power down mode when PDN is low and PD is high so that N27, P33, N36 and N37 are on and N26, P34 and N35 are off. Under normal operating conditions, the signals are reversed so that N27, P33, N36 and N37 are off and N26, P34 and N35 are on.

As previously noted, amplifier 20 is adapted to be used in connection with other circuit and control components of an integrated circuit (IC) which may be embodied on a computer network card. These components are shown in block diagram form in FIG. 3 and may be fabricated on a single IC chip identified generally by the reference numeral 300. A current reference circuit 301 generates a constant bias current which is applied to a voltage reference circuit 302 to generate a stable reference voltage which in the illustrated embodiment is 1 V. The analog reference signal outputted from circuit 302 is applied to a buffer/power amplifier circuit 303 which includes the symmetrical analog power amplifier20.

Circuit 303 operates under the control of logic control circuits 304, which communicates with a computer interface bus 306, to provide an analog signal (1 V in the illustrated embodiment) capable of driving a large load. In particular, the analog signal from buffer/power amplifier 303 is provided to I/O pin device 305 which may have up to 100 PCI pins. I/O device 305 interfaces with a PCI bus 307 which may have up to 100 PCI traces.

The IC 300 has a "hot plug-in" function. That is, when the network card having the IC 300 embodied thereon is inserted into a computer adapted to receive such a card, it is not necessary to turn off the power supply of the computer 308. When the network card is properly inserted, the interface bus 306 transmits a power signal to the logic control circuits 304 to turn on the circuits on the IC 300 and also transmits a signal to turn off the PCI bus 307. The circuits on the IC 300 operate to charge the PCI pins to a certain voltage, such as 1 V. Typically, the charge process takes on the order of 1 ms. After the charging process is complete, the buffer/power amplifier 303 is turned off or placed in power down mode and a feedback signal is transmitted from the logic control circuits 304 to the interface bus 306 which, in response, turns on the PCI bus 307.

While the invention has been described in conjunction with specific embodiments, it will be evident to those skilled in the art in light of the foregoing description that many further alternatives, modifications and variations are possible. Thus, the invention described herein is intended to embrace all such alternatives, modifications, applications and variations as may fall within the spirit and scope of the appended claims.

What is claimed is:

1. An amplifier, comprising:
  an input stage comprising a pair of input MOS transistors which receives an input signal and a first output node where a first output voltage is generated; and
  an output stage comprising:
    an intermediate current source circuit comprising a plurality of MOS transistors including a first current source transistor, a control transistor and a second current source transistor connected in series, wherein a node connecting the control transistor and the second current source transistor is connected to the node on which the first output voltage is generated, and wherein a second output voltage is generated on a node connecting the first current source transistor and the control transistor, and
    a plurality of output transistors including a first output transistor responsive to the first output voltage and a second output transistor responsive to the second output voltage, wherein the output stage generates a third output voltage.

2. The amplifier of claim 1, wherein the second output voltage is responsive to the first output voltage.

3. The amplifier of claim 2, wherein the second output voltage is approximately equal to the sum of the first output voltage and an internal voltage of the control transistor.

4. The amplifier of claim 3, wherein the internal voltage of the control transistor is its gate-to-source voltage which is controlled by the size of the control transistor and the current of the second current source transistor.

5. The amplifier of claim 4, wherein the first and second output transistors are interconnected to form an output node where the third output signal is generated.

6. The amplifier of claim 1, further comprising a transmission gate interconnecting a gate of the control transistor with the node on which the second output voltage is connected.

7. The amplifier of claim 1, further comprising a power down circuit.

8. A method of making an amplifier, comprising:
  providing an input stage comprising a pair of input MOS transistors which receives an input signal and a first output node where a first output voltage is generated; and
  providing an output stage comprising:
    providing an intermediate current source circuit comprising a plurality of MOS transistors including a first current source transistor, a control transistor and a second current source transistor connected in series, wherein a node connecting the control transistor and the second current source transistor is connected to the node on which the first output voltage is generated, and wherein a second output voltage is generated on a node connecting the first current source transistor and the control transistor, and
    providing a plurality of output transistors including a first output transistor responsive to the first output voltage and a second output transistor responsive to the second output voltage, wherein the output stage generates a third output voltage.

9. The method of claim 8, wherein the second output voltage is responsive to the first output voltage.

10. The method of claim 9, wherein the second output voltage is approximately equal to the sum of the first output voltage and an internal voltage of the control transistor.

11. The method of claim 10, wherein the internal voltage of the control transistor is its gate-to-source voltage which is controlled by the size of the control transistor and the current of the second current source transistor.

12. The method of claim 11, wherein the first and second output transistors are interconnected to form an output node where the third output signal is generated.

13. The method of claim 8, further comprising providing a power down circuit.

14. An apparatus, comprising:
  an amplifier, comprising:
    an input stage comprising a pair of input MOS transistors which receives an input signal and a first output node where a first output voltage is generated; and
    an output stage comprising:
      an intermediate current source circuit comprising a plurality of MOS transistors including a first current source transistor, a control transistor and a second current source transistor connected in series, wherein a node connecting the control transistor and the second current source transistor is connected to the node on which the first output voltage is generated, and wherein a second output voltage is generated on a node connecting the first current source transistor and the control transistor, and
      a plurality of output transistors including a first output transistor responsive to the first output voltage and a second output transistor responsive to the second output voltage, wherein the output stage generates a third output voltage.

15. The apparatus of claim 14, wherein the apparatus is an integrated circuit and wherein the amplifier forms part of the integrated circuit.

16. The apparatus of claim 15, wherein the apparatus is a network card having at least one integrated circuit embodied thereon and wherein the amplifier forms part of the integrated circuit.

* * * * *